(12) United States Patent
Kreiner et al.

(10) Patent No.: US 8,154,256 B2
(45) Date of Patent: Apr. 10, 2012

(54) BATTERY THERMAL EVENT DETECTION SYSTEM USING AN ELECTRICAL CONDUCTOR WITH A THERMALLY INTERRUPTIBLE INSULATOR

(75) Inventors: Paul Bryan Kreiner, Palo Alto, CA (US); Weston Arthur Hermann, Palo Alto, CA (US); Scott Ira Kohn, Redwood City, CA (US); Andrew David Baglino, San Francisco, CA (US)

(73) Assignee: Tesla Motors, Inc., Palo Alto, CA (US)

( * ) Notice: Subject to any disclaimer, the term of this patent is extended or adjusted under 35 U.S.C. 154(b) by 573 days.

(21) Appl. No.: 12/455,248

(22) Filed: May 28, 2009

(65) Prior Publication Data
US 2010/0136384 A1 Jun. 3, 2010

(51) Int. Cl.
*H01M 10/46* (2006.01)
(52) U.S. Cl. .................................................. 320/150
(58) Field of Classification Search .................. 320/104, 320/107, 114, 150, 153; 324/426, 427, 431, 324/433; 361/93.8, 106, 165
See application file for complete search history.

(56) References Cited

U.S. PATENT DOCUMENTS

| | | | | |
|---|---|---|---|---|
| 6,903,534 B2 * | 6/2005 | Minamiura | ................... | 320/150 |
| 7,433,794 B1 * | 10/2008 | Berdichevsky et al. | ...... | 320/150 |
| 7,766,544 B2 * | 8/2010 | Shibuya et al. | ............... | 320/150 |
| 2009/0139781 A1 * | 6/2009 | Straubel | ...................... | 180/65.1 |

* cited by examiner

*Primary Examiner* — Edward Tso
(74) *Attorney, Agent, or Firm* — Patent Law Office of David G. Beck

(57) ABSTRACT

A method and apparatus is provided for determining when a battery, or one or more batteries within a battery pack, undergoes an undesired thermal event such as thermal runaway. The system uses an insulated conductive member mounted in close proximity to, or in contact with, an external surface of the battery or batteries to be monitored. A voltage measuring system is coupled to the conductive core of the insulated conductive member, the voltage measuring system outputting a first signal when the temperature corresponding to the battery or batteries is within a prescribed temperature range and a second signal when the temperature exceeds a predetermined temperature that falls outside of the prescribed temperature range.

20 Claims, 4 Drawing Sheets

BATTERY THERMAL EVENT DETECTION SYSTEM USING AN ELECTRICAL CONDUCTOR WITH A THERMALLY INTERRUPTIBLE INSULATOR

FIELD OF THE INVENTION

The present invention relates generally to batteries and battery packs and, more particularly, to a system for detecting thermal events in a battery or battery pack.

BACKGROUND OF THE INVENTION

Batteries can be broadly classified into primary and secondary batteries. Primary batteries, also referred to as disposable batteries, are intended to be used until depleted, after which they are simply replaced with one or more new batteries. Secondary batteries, more commonly referred to as rechargeable batteries, are capable of being repeatedly recharged and reused, therefore offering economic, environmental and ease-of-use benefits compared to a disposable battery.

Although rechargeable batteries offer a number of advantages over disposable batteries, this type of battery is not without its drawbacks. In general, most of the disadvantages associated with rechargeable batteries are due to the battery chemistries employed, as these chemistries tend to be less stable than those used in primary cells. Due to these relatively unstable chemistries, secondary cells often require special handling during fabrication. Additionally, secondary cells such as lithium-ion cells tend to be more prone to thermal runaway than primary cells, thermal runaway occurring when the internal reaction rate increases to the point that more heat is being generated than can be withdrawn, leading to a further increase in both reaction rate and heat generation. Eventually the amount of generated heat is great enough to lead to the combustion of the battery as well as materials in proximity to the battery. Thermal runaway may be initiated by a short circuit within the cell, improper cell use, physical abuse, manufacturing defects, or exposure of the cell to extreme external temperatures.

Thermal runaway is of major concern since a single incident can lead to significant property damage and, in some circumstances, bodily harm or loss of life. When a battery undergoes thermal runaway, it typically emits a large quantity of smoke, jets of flaming liquid electrolyte, and sufficient heat to lead to the combustion and destruction of materials in close proximity to the cell. If the cell undergoing thermal runaway is surrounded by one or more additional cells as is typical in a battery pack, then a single thermal runaway event can quickly lead to the thermal runaway of multiple cells which, in turn, can lead to much more extensive collateral damage. Regardless of whether a single cell or multiple cells are undergoing this phenomenon, if the initial fire is not extinguished immediately, subsequent fires may be caused that dramatically expand the degree of property damage. For example, the thermal runaway of a battery within an unattended laptop will likely result in not only the destruction of the laptop, but also at least partial destruction of its surroundings, e.g., home, office, car, laboratory, etc. If the laptop is on-board an aircraft, for example within the cargo hold or a luggage compartment, the ensuing smoke and fire may lead to an emergency landing or, under more dire conditions, a crash landing. Similarly, the thermal runaway of one or more batteries within the battery pack of a hybrid or electric vehicle may destroy not only the car, but may lead to a car wreck if the car is being driven or the destruction of its surroundings if the car is parked.

One approach to overcoming this problem is by reducing the risk of thermal runaway. For example, to prevent batteries from being shorted out during storage and/or handling, precautions can be taken to ensure that batteries are properly stored, for example by insulating the battery terminals and using specifically designed battery storage containers. Another approach to overcoming the thermal runaway problem is to develop new cell chemistries and/or modify existing cell chemistries. For example, research is currently underway to develop composite cathodes that are more tolerant of high charging potentials. Research is also underway to develop electrolyte additives that form more stable passivation layers on the electrodes. Although this research may lead to improved cell chemistries and cell designs, currently this research is only expected to reduce, not eliminate, the possibility of thermal runaway. Accordingly, what is needed is a means for detecting thermal runaway events, and more preferably detecting a precursor to thermal runaway, thereby providing time to eliminate, or at least minimize, damage to adjacent cells and materials. The present invention provides such a means.

SUMMARY OF THE INVENTION

The present invention provides a method and apparatus for determining when a battery, or one or more batteries within a battery pack, undergoes an undesired thermal event such as thermal runaway. The system of the invention uses an insulated conductive member mounted in close proximity to, or in contact with, an external surface of the battery or batteries to be monitored. A voltage measuring system is coupled to the conductive core of the insulated conductive member, the voltage measuring system outputting a first signal when the temperature corresponding to the battery or batteries is within a prescribed temperature range and a second signal when the temperature exceeds a predetermined temperature that falls outside of the prescribed temperature range.

In at least one embodiment of the invention, a battery thermal event detection system is provided comprised of an insulated conductive member that includes a conductive core and an insulator covering the conductive core, where the insulated conductive member is proximate to an external surface of at least one battery. When the temperature of the at least one battery exceeds a predetermined temperature, a portion of the insulator melts or otherwise becomes electrically non-insulating. The system is further comprised of a voltage measuring system coupled to the insulated conductive member, the voltage measuring system outputting a first signal when the battery is operating within a prescribed temperature range and a second signal when the temperature exceeds a predetermined temperature that falls outside of the prescribed temperature range. The system may be used with a single battery or multiple batteries. The insulated conductive member may either float or be coupled to a reference voltage source and a current limiting resistor. The voltage measuring system may monitor the voltage of the insulated conductive member relative to a reference voltage or ground or across a current limiting resistor. The system may further include a second conductive member coaxially located with the insulated conductive member, where the second conductive member is coupled to a reference voltage source and a current limiting resistor. The insulated conductive member may be held in place with bonding/potting material, mechanical clips, or other means. The system may include a system controller coupled to the voltage measuring system, the system controller providing a response when a thermal event is detected. The system controller may be coupled to an ambient battery temperature monitor. System controller responses may include activating a warning indicator, activating a battery cooling system, activating a fire control system, and transmitting a thermal event notification report.

In at least one embodiment of the invention, a method of detecting a battery thermal event is provided, the method comprising the steps of positioning an insulated conductive member in proximity to the external surface of at least one battery, monitoring the voltage of the conductive core of the insulated conductive member where the measured voltage is within a first range of voltages when the battery temperature is within a prescribed temperature range and within a second range of voltages when the battery temperature exceeds a predetermined temperature, and outputting to a system controller a first signal when the voltage is within the first range of voltages and a second signal when the voltage is within the second range of voltages. The voltage monitoring step may be performed by measuring the voltage relative to ground or across a current limiting resistor. The method may further include the step of electrically floating the conductive core of the insulated conductive member. The method may further include the step of connecting the conductive core of the insulated conductive member to a reference voltage source and a current limiting resistor. The method may further include the step of positioning a second insulated conductive member coaxially with the first insulated conductive member, where the conductive core of the second insulated conductive member is coupled to a voltage reference source and a current limiting resistor.

A further understanding of the nature and advantages of the present invention may be realized by reference to the remaining portions of the specification and the drawings.

DESCRIPTION OF THE SPECIFIC EMBODIMENTS

In the following text, the terms "battery", "cell", and "battery cell" may be used interchangeably and may refer to any of a variety of different cell chemistries and configurations including, but not limited to, lithium ion (e.g., lithium iron phosphate, lithium cobalt oxide, other lithium metal oxides, etc.), lithium ion polymer, nickel metal hydride, nickel cadmium, nickel hydrogen, nickel zinc, silver zinc, or other battery type/configuration. The term "battery pack" as used herein refers to multiple individual batteries contained within a single piece or multi-piece housing, the individual batteries electrically interconnected to achieve the desired voltage and capacity for a particular application. The term "electric vehicle" as used herein refers to all-electric vehicles, hybrid electric vehicles and plug-in hybrid vehicles. Lastly, identical element symbols used on multiple figures refer to the same component, or components of equal functionality.

As illustrated and described below, the present invention provides a means for determining whether the monitored temperature of one or more batteries exceeds a predetermined temperature, the predetermined temperature falling outside of a desired and preferred operating range. In accordance with the invention, the predetermined temperature is preferably selected to indicate either that the battery or batteries in question are undergoing thermal runaway, or that they are becoming so hot that thermal runaway is imminent, either of these conditions also being referred to herein as a "thermal event".

In general, the present invention monitors the voltage of an insulated conductive member located in close proximity to, or in contact with, the battery or batteries to be monitored. As the temperature of the battery or batteries being monitored increases past a predetermined temperature during a thermal event, the insulator covering the conductive core of the insulated conductive member melts away or otherwise becomes electrically non-insulating, allowing the conductive core to make electrical contact with the cell case or an adjacent component or, as in some embodiments, an adjacent conductor that is held at an elevated voltage. As a result, and depending upon the system configuration as described further below, the measured voltage of the conductive core changes, indicating the occurrence of the thermal event.

Figure 1:
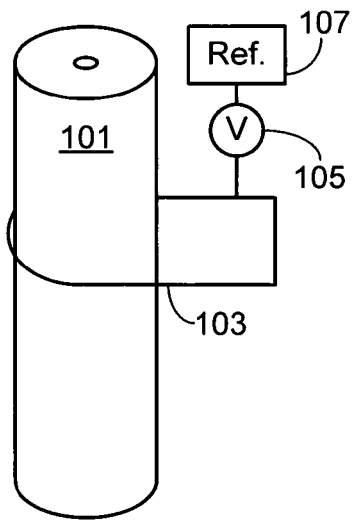
FIG. 1 illustrates a preferred embodiment of the invention utilizing an insulated conductive member in close proximity to, or in contact with, a single battery.
Figure 2:
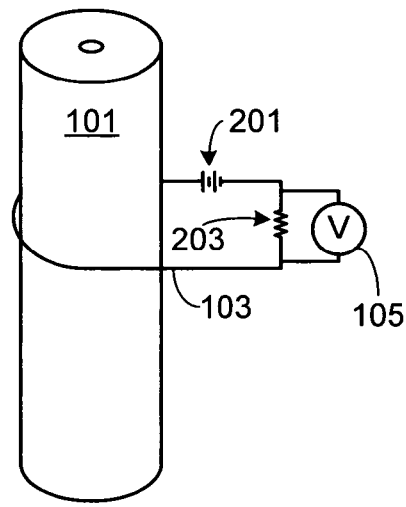
FIG. 2 illustrates a modification of the embodiment shown in FIG. 1, the modification providing means to stabilize the nominal voltage.
Figure 3:
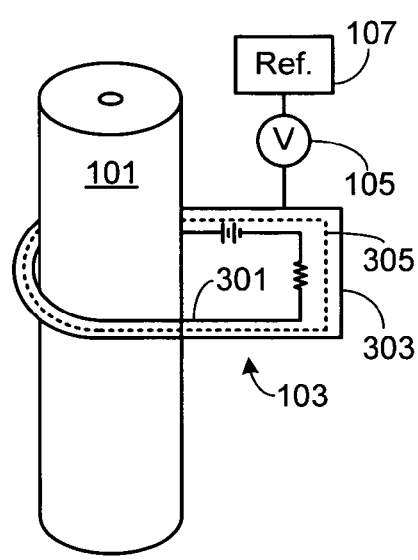
FIG. 3 illustrates an alternate preferred embodiment utilizing a coaxial pair of conductors.

FIGS. 1-3 illustrate some of the primary techniques of configuring the insulated conductive member of the invention. To simplify the illustrations, a single battery 101 is shown in each of the embodiments of FIGS. 1-3, although it should be appreciated that the inventors consider the primary application for the invention to be monitoring a plurality of batteries, for example the batteries within a battery pack. Additionally, and as described more fully below, preferably the system of the invention couples the voltage monitor to a system controller (not shown in FIGS. 1-3), the system controller providing control over the monitor as well as the means used to respond to identified thermal events.

As shown in FIG. 1, an insulated conductive member 103 is positioned in close proximity to, or in contact with, an external surface of battery 101. Preferably, member 103 is comprised of a wire with a sufficiently high melting point that the wire will remain intact during the occurrence of the thermal event, or at least remain intact during the early stages of the thermal event. Member 103 also includes an electrical insulator covering or coating the core (e.g., wire) of the member, the insulator selected such that it will melt or otherwise lose its electrically insulating properties when the temperature of the battery reaches the predetermined temperature that is indicative of the thermal event. In at least one preferred embodiment, the external surface of the battery selected to be in contact with, or proximate to, the insulated conductive member is the venting region of the battery, thus ensuring that the insulated conductive member is exposed to extreme heat during a thermal runaway event. Member 103 may only be proximate to, or in contact with, a relatively small portion of battery 101 as shown in FIG. 1, or it may be wrapped around battery 101 one or more times (not shown).

In the embodiment of FIG. 1, the conductive core of member 103 is electrically floating. Voltage measuring system 105, also referred to herein as a voltmeter, monitors the voltage between member 103 and a reference 107. Reference 107 may be the system ground or any reference voltage (e.g., battery positive, battery negative, etc.). Preferably the battery casing is in electrical communication with the device electronics, for example acting as the negative terminal of the battery. During a thermal event, the insulator of member 103 melts away or otherwise becomes electrically conductive, allowing the conductive core to make electrical contact with the metal cell casing or, as in some embodiments, an adjacent element of the system (e.g., battery pack enclosure). This results in a detectable voltage change that can be used to indicate the occurrence of the thermal event.

In a minor variation of the embodiment described above, the insulator covering member 103 acts as a very poor conductor during normal conditions. During a thermal event, its electrical insulating properties change, either due to inherent properties of the material or due to a change in the spacing between the conductive core of member 103 and the adjacent cell casing, resulting in a detectable voltage change.

In the embodiment illustrated in FIG. 2, the conductive core of member 103 is electrically connected to a reference voltage source 201 and a current limiting resistor 203. Preferably voltage measuring system 105 monitors the voltage across resistor 203. The advantage of this embodiment over that shown in FIG. 1 is that the nominal voltage corresponding to member 103 is stabilized, thus making it easier to differentiate between the nominal voltage of member 103 and the monitored voltage during a thermal event.

In the embodiment illustrated in FIG. 3, member 103 is comprised of a pair of coaxial conductive cores 301/303, separated by an insulator 305. One of the conductive cores, e.g., core 301, is electrically connected to reference voltage source 201 and current limiting resistor 203. The second core, e.g., core 303, is allowed to electrically float. Voltage measuring system 105 monitors the voltage relative to floating core 303. During a thermal event, insulator 305 melts, allowing conductive cores 301 and 303 to come into contact with one another. As a result, the voltage of conductive core 303 changes, indicating that the battery temperature has exceeded the predetermined temperature. Preferably in this embodiment, both conductors 301 and 303 are coated or covered by an insulator comprised of the same insulating material as that used to separate the conductive cores, or comprised of an insulating material with a different melting temperature.

Figure 4:
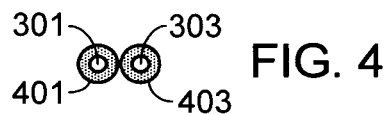
FIG. 4 is a cross-sectional view of a coaxial pair of conductors for use with an embodiment of the invention such as that shown in FIG. 3.
Figure 5:
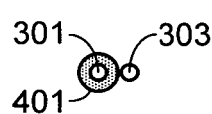
FIG. 5 is a cross-sectional view of an alternate coaxial pair of conductors.
Figure 6:
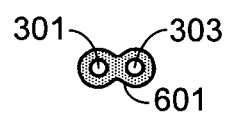
FIG. 6 is a cross-sectional view of an alternate coaxial pair of conductors.
Figure 7:
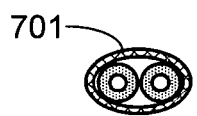
FIG. 7 is a cross-sectional view of an alternate coaxial pair of conductors.
Figure 8:
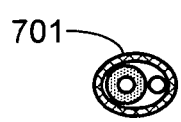
FIG. 8 is a cross-sectional view of an alternate coaxial pair of conductors.

As previously described, the insulated conductive member used in the embodiments shown in FIGS. 1 and 2 is relatively straightforward, i.e., an electrically conductive core surrounded by an electrically insulating shield. In contrast, the dual conductor approach described relative to FIG. 3 lends itself to a variety of configurations. For example, FIG. 4 is a cross-sectional view of a configuration in which each conductive core 301/303 is encased in its own insulator, specifically insulators 401 and 403. Although not preferred, in at least one embodiment only one of the conductors, e.g., conductor 301, is insulated, as shown in FIG. 5. In the alternate configuration shown in FIG. 6, a single insulator 601 is used to both separate, and cover, conductors 301 and 303. FIG. 7 illustrates an alternate configuration of the conductor pair shown in FIG. 4, specifically adding an outer electrically insulating tube or jacket 701 around the two conductors 301/303 and their respective insulators 401/403. Assuming that tube 701 has a higher melting point than insulators 401/403, this approach has the added advantage of preventing conductors 301 and 303 from contacting other metallic surfaces when the insulators 401/403 melt, thereby improving the signal-to-noise ratio of the voltage measurement and, in some configurations, preventing exposure of the measurement signal to high voltage. Tube, or jacket, 701 can also be used with other configurations. For example, FIG. 8 shows the configuration of FIG. 5 contained within a jacket 701. Preferably tube 701, while being electrically insulating, is thermally conductive, thus insuring that the inner insulators, e.g., insulators 401/403, are not shielded from the battery thermal event.

As previously noted, the composition of conductors 103, 301 and 303 is selected to ensure that the conductor(s) does not melt during a thermal event, or at least not during the onset of the thermal event. Depending upon the battery chemistry involved, suitable materials include aluminum, copper and any of a variety of alloys commonly used for wires and cables. The composition of the insulator covering the conductor is primarily based on its melting point, the desired melting point being indicative of the thermal event in question which, in turn, is based on the operating and thermal characteristics of the battery to be monitored. Although not an exhaustive list, exemplary insulator materials include fluorinated ethylene-propylene (FEP) Teflon, perfluoroalkoxy polymer resin (PFA) Teflon, polytetrafluoroethene (TFE or PTFE) Teflon, ethylene tetrafluoroethylene copolymer (ETFE), polyvinyl chloride (PVC), polyimide (Kapton), polypropylene, polyolefin, crosslinked polyalkene, and a variety of other materials and plastics.

As previously described, during a thermal event it is important that member 103 be in close proximity to the battery or batteries being monitored, thus ensuring an accurate registration of the thermal event. Additionally, in the case of a single conductor, it is very important that the conductor come into contact with the battery casing as soon as the insulator melts away from the conductor, thus allowing a rapid response to the thermal event. It will be appreciated that there are a variety of techniques that can be used to accomplish these goals. For example, member 103 can be placed under the battery or batteries in question, preferably between the battery(s) and a battery enclosure, such that during a thermal event the weight of the battery helps to ensure contact between the conductor and the battery casing once the insulator melts away. Alternately, the battery can be positioned in close proximity to a battery enclosure or to another battery so that member 103 is pressed firmly in place once positioned. Alternately, a simple clip or other mechanical attachment means can be used to press member 103 against the cell(s). Additionally, a potting compound or an adhesive can be used to properly locate and position member 103 relative to the cell(s).

In the embodiment in which member 103 is comprised of a pair of conductors 301/303, it is important that the conductors come into contact with one another during the onset of a thermal event when the separating insulator melts away. One approach that promotes contact between the conductors is to twist them together prior to installation next to the battery or batteries.

Regardless of which of the previously described techniques of detecting a thermal event is applied, preferably the voltage measuring system 105 is coupled to a system controller. An exemplary embodiment based on the configuration of FIG. 2 is provided in FIG. 9, although it should be understood that this approach is equally applicable to the other previously described configurations.

Figure 9:
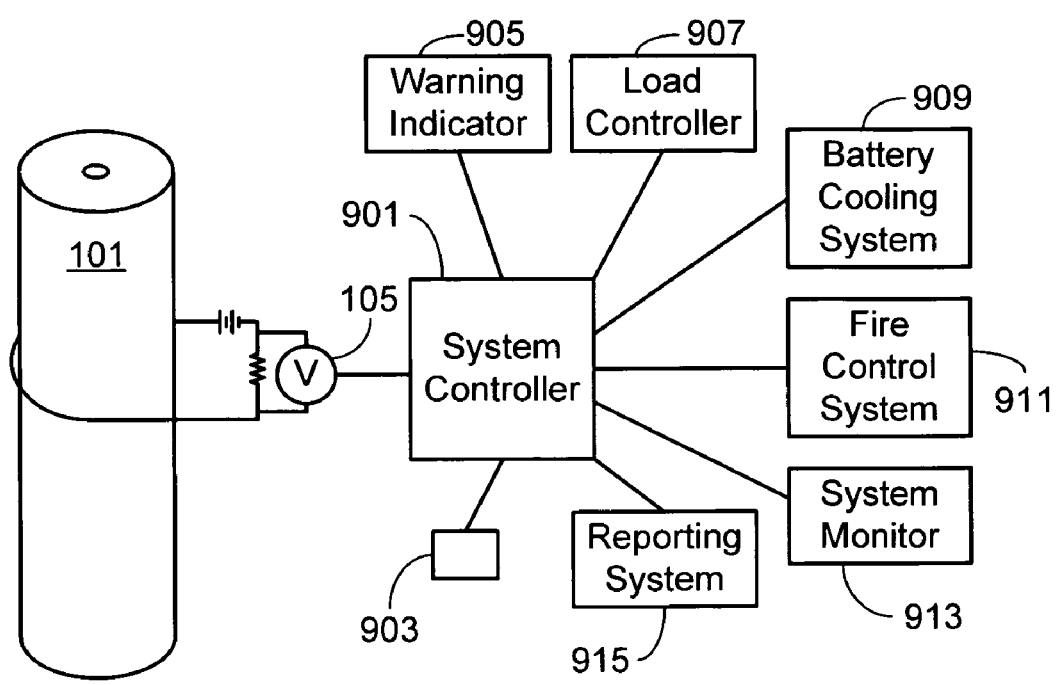
FIG. 9 illustrates a preferred embodiment of the invention coupled to a system controller and a variety of thermal event response systems.

As shown in FIG. 9, coupled to voltage measuring system 105 is a system controller 901. As the output of system 105 varies with the voltage of member 103, by monitoring the output of system 105, system controller 901 can determine when an excessive cell temperature has been reached. Specifically and as previously noted, the measured voltage of the conductor(s) of member 103 can be used to determine the thermal health of the battery or batteries in question.

Voltage measuring system 105 can be used to either continuously monitor member 103 or monitor it intermittently, thereby conserving system power. In at least one embodiment, system controller 901 is used to determine when voltage measuring system 105 measures the voltage of member 103. For example, voltage measuring system 105 can be programmed to test at a preset frequency (e.g., once every five seconds), or only under certain circumstances (e.g., when the battery or batteries are under load conditions). In at least one embodiment, system controller 901 is coupled to one or more temperature monitors 903, temperature monitor(s) 903 monitoring ambient battery/battery pack temperature. As the likelihood of a battery undergoing thermal runaway and the risk of such an event spreading to other cells increases with increased ambient temperature, this information can be used, for example, to increase the frequency at which the health of a battery is monitored using the thermal monitoring system of the invention.

Once an excessive rise in temperature has been detected by the system of the invention, system controller 901 can be programmed to perform any of a variety of responses. It will be appreciated that the system can be programmed to perform either single or multiple responses, and in the latter case the responses can be performed serially or in parallel. Although there are any number of possible responses, in general the response is governed by the application in question. For example, a suitable response for the batteries contained in a laptop may be quite different from the response for the batteries in an electric vehicle. Exemplary responses include:

- A warning indicator 905 may be coupled to system controller 901 that provides a visual or audible indicator, or both, of a detected battery thermal event. For example, in an electric vehicle, indicator 905 may be an indicator light mounted in an instrument cluster on the dashboard and/or a sound generator coupled to, or separate from, the vehicle's audio system.
- System controller 901 may be coupled to means 907 for modifying the load on the battery or batteries. If the thermal event detected by the system is a precursor to thermal runaway, eliminating or at least reducing the load may prevent further increases in battery temperature, thereby possibly preventing battery thermal runaway. Means 907 also helps to achieve a controlled shut-down of the devices/applications powered by the battery or batteries in question. Typically means 907 is a control circuit used to control and couple the power from the battery(s) to the device/application.
- An emergency battery cooling system 909 may be coupled to system controller 901, system 909 being activated when a thermal event is detected, thus helping to reduce the temperature of the battery or batteries exhibiting increased temperature. Preferably cooling system 909 is in addition to any cooling system routinely used to control the temperature of the battery(s). Alternately, activation of cooling system 909 may simply increase the cooling capacity of an already operating cooling system. The purpose of cooling system 909 is to try and prevent thermal runaway from occurring if the monitored thermal event is a precursor to thermal runaway, and if thermal runaway is already occurring, prevent its propagation to neighboring cells. Cooling system 909 may be comprised of either a liquid or gas based cooling system.
- An emergency fire extinguishing system 911 may be coupled to system controller 901. It will be appreciated that when a battery undergoes thermal runaway, the temperatures are sufficient to cause the combustion of cell materials and/or materials in proximity to the affected cells. Accordingly the purpose of fire extinguishing system 911 is to contain any such fire and prevent it from spreading to adjacent components/materials. Fire extinguishing system 911 may be either liquid or gas based.
- In a battery pack containing a large number of cells, the system may be designed to continue operation even after one or more cells have ceased operation due to a thermal runaway event. Accordingly, in at least one embodiment system controller 901 is coupled to an event recording system 913, system 913 preferably recording the time and date of the thermal event. A record of thermal events can later be used to determine potential battery failure mechanisms, for example by noting the demands being placed on the battery-powered device/application at the time of failure or the ambient temperature at the time of failure. Additionally, this information can be used to diagnose other, related issues with the battery-powered device/application. For example, if the malfunctioning battery is part of an electric vehicle's battery pack, a record of this thermal event can be used to diagnose an exhibited loss of vehicle power, charging problems, etc. System 913 may be integrated within system controller 901, or separate from system controller 901, e.g., integrated within a device controller.
- In at least one embodiment, system controller 901 is coupled to an on-board communication system 915 that reports thermal events to a user and/or service provider via a communication network such as cellular, internet, satellite or other network (not shown). This system allows the end user to be notified of a problem even if they are not in close proximity to the battery-powered device/application. Alternately, the system can be used to notify a pre-selected service company that a thermal event has been monitored that will require servicing. Alternately, the system can be used to notify an emergency service provider, for example a towing/repair service if the battery-powered device in question is an electric vehicle. Exemplary vehicle communication systems are given in co-pending U.S. patent application Ser. No. 11/818,838, filed Jun. 15, 2007 and Ser. No. 11/779,678, filed Jul. 18, 2007, the disclosures of which are incorporated herein for any and all purposes.

Figure 10:
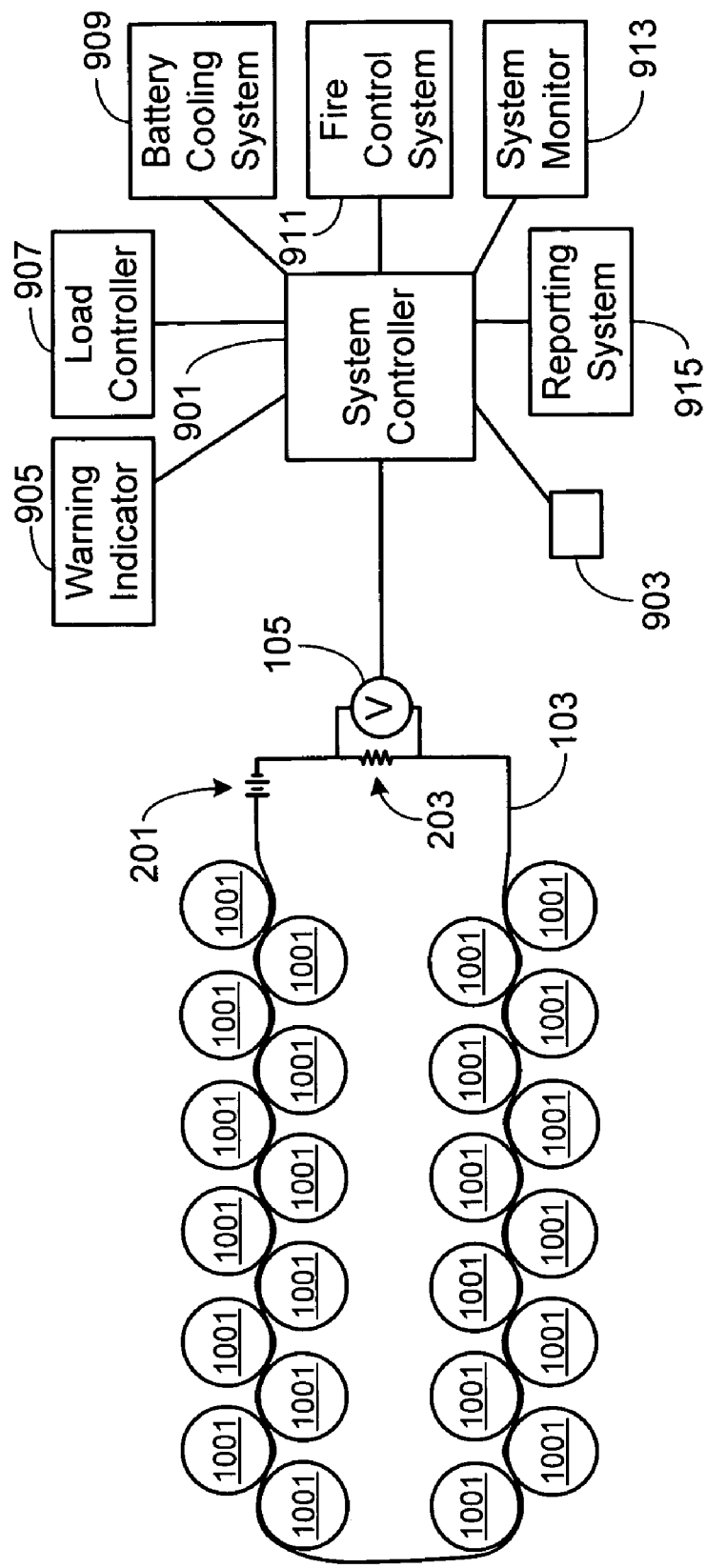
FIG. 10 illustrates the embodiment shown in FIG. 9, coupled to a plurality of batteries.

As previously noted, although the invention can be used to monitor for thermal events associated with a single battery, preferably it is used to monitor the health of a large number of batteries, for example within a battery pack. FIG. 10 illustrates one such embodiment based on the configuration shown in FIG. 9. It should be understood that multi-cell monitoring can also use the techniques described relative to FIGS. 1 and 3, and that a system can use some, none, or all of the response capabilities shown in the illustration.

As shown in FIG. 10, member 103 passes in close proximity to, or in contact with, a portion of the external surface of a plurality of batteries 1001. In this embodiment, when the temperature of any single cell exceeds the thermal event threshold of the system, the change is detected by voltage measuring system 105 which, in turn, sends a notification signal to system controller 901. Additionally, in some configurations, the voltage detected by system 105 can be used to identify which battery or group of batteries within a battery pack has experienced the thermal event.

Figure 11:
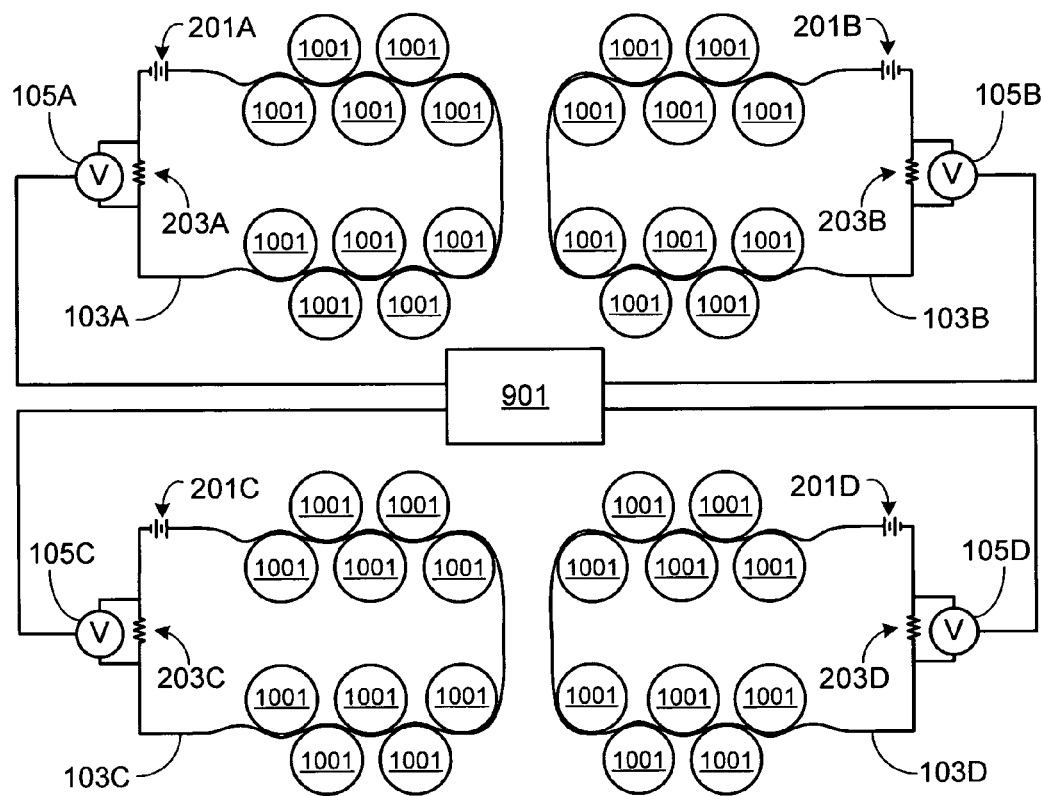
FIG. 11 illustrates an embodiment coupled to a plurality of battery subsets, the battery subsets associated with a single battery pack.

Although a single conductive member may be used to monitor the health of some or all of the batteries of a battery pack, in at least one embodiment of the invention the battery pack is divided into multiple groups of cells, each group comprised of a plurality of cells as shown in FIG. 11. In the exemplary embodiment shown in FIG. 11, the battery pack is divided into four battery subsets. It will be appreciated that a battery pack utilizing the invention may be divided into more or less cell groupings, and that each group may contain more or less cells than shown in the exemplary embodiment. In the illustrated embodiment, each cell group has a dedicated voltage measuring system. Alternately, multiplexing can be used to simplify the design by allowing each battery subset to use the same voltage measuring system (not shown).

Depending upon the size of the battery pack to be monitored, dividing the pack into multiple cell groups, each of which is individually monitored, offers a number of benefits. First, it allows an affected battery group of the pack to be identified and then decoupled from the battery pack, and thus decoupled from the device and/or application being powered by the battery pack. Decoupling the affected subset of the battery pack, in some configurations, allows the battery-powered device/application to continue to operate, albeit at reduced power. Second, dividing the battery pack into cell subsets allows specific measures to be taken for the affected subset only, measures such as additional cooling and/or deployment of fire retardants, etc. Third, individually monitoring battery subsets simplifies diagnostics and repair, as the affected cells are identified. Fourth, identifying a battery pack subset that is experiencing a thermal event allows measures such as increased cooling to be applied to nearby subsets, thus decreasing the possibility of the thermal event propagating throughout the battery pack.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A detection system for detecting a battery thermal event, the detection system comprising:
    at least one battery;
    an insulated conductive member comprised of a conductive core and an insulator covering said conductive core, said insulated conductive member proximate to an external surface of said at least one battery, wherein a portion of said insulator melts when a temperature corresponding to said at least one battery exceeds a predetermined temperature; and
    a voltage measuring system coupled to said insulated conductive member and monitoring a voltage corresponding to said insulated conductive member, wherein said voltage measuring system outputs a first signal when said at least one battery is operating within a prescribed temperature range and outputs a second signal when said temperature corresponding to said at least one battery exceeds said predetermined temperature, wherein said predetermined temperature is outside of said prescribed temperature range.

2. The detection system of claim 1, wherein said insulated conductive member is electrically floating, and wherein said voltage measuring system monitors said voltage corresponding to said insulated conductive member relative to ground.

3. The detection system of claim 1, wherein said insulated conductive member is electrically floating, and wherein said voltage measuring system monitors said voltage corresponding to said insulated conductive member relative to a reference voltage.

4. The detection system of claim 1, further comprising:
    a second conductive member, wherein said insulated conductive member and said second conductive member are coaxial, and wherein said insulator separates said conductive core of said insulated conductive member from said second conductive member;
    a reference voltage source coupled to said second conductive member;
    a current limiting resistor coupled to said second conductive member; and
    wherein said voltage measuring system outputs said second signal when said portion of said insulator melts and said conductive core of said insulated conductive member makes electrical contact with said second conductive member.

5. The detection system of claim 4, further comprising an electrically insulating jacket, wherein at least a portion of said insulated conductive member and at least a portion of said second conductive member are contained within said electrically insulating jacket.

6. The detection system of claim 1, further comprising a reference voltage source coupled to said insulated conductive member, and a current limiting resistor coupled to said insulated conductive member.

7. The detection system of claim 6, wherein said voltage measuring system monitors said voltage across said current limiting resistor.

8. The detection system of claim 1, wherein said at least one battery corresponds to one battery of a plurality of batteries, wherein said insulated conductive member is proximate to each of said plurality of batteries, and wherein said voltage measuring system outputs said second signal when a battery temperature corresponding to any of said plurality of batteries exceeds said predetermined temperature.

9. The detection system of claim 1, further comprising:
    a system controller coupled to said voltage measuring system; and
    at least one battery temperature monitor, said at least one battery temperature monitor monitoring ambient battery temperature.

10. The detection system of claim 1, further comprising a system controller coupled to said voltage measuring system, wherein said system controller activates a warning indicator when said system controller receives said second signal from said voltage measuring system.

11. The detection system of claim 1, further comprising a system controller coupled to said voltage measuring system, wherein said system controller activates a battery cooling system when said system controller receives said second signal from said voltage measuring system.

12. The detection system of claim 1, further comprising a system controller coupled to said voltage measuring system, wherein said system controller activates a fire control system when said system controller receives said second signal from said voltage measuring system.

13. The detection system of claim 1, further comprising a system controller coupled to said voltage measuring system, and further comprising a communication system coupled to said system controller, wherein said system controller transmits a thermal event notification report via said communication system when said system controller receives said second signal from said voltage measuring system.

14. A method for detecting a battery thermal event, the method comprising the steps of:
- positioning an insulated conductive member in proximity to an external surface of at least one battery, wherein said insulated conductive member is comprised of a conductive core and an insulator covering said conductive core;
- monitoring a voltage corresponding to said conductive core of said insulated conductive member, wherein said voltage is within a first range of voltages when a battery temperature corresponding to said at least one battery is within a prescribed temperature range, and wherein said voltage is within a second range of voltages when said battery temperature exceeds a predetermined temperature and a portion of said insulator melts, wherein said predetermined temperature is outside of said prescribed temperature range;
- outputting a first signal to a system controller when said voltage is within said first range of voltages; and
- outputting a second signal to said system controller when said voltage is within said second range of voltages.

15. The method of claim 14, further comprising the step of electrically floating said conductive core of said insulated conductive member.

16. The method of claim 15, wherein said monitoring step further comprises the step of measuring said voltage relative to ground.

17. The method of claim 15, wherein said monitoring step further comprises the step of measuring said voltage relative to a reference voltage.

18. The method of claim 15, further comprising the steps of:
- positioning a second insulated conductive member coaxially to said insulated conductive member, said second insulated conductive member comprised of a second conductive core;
- electrically connecting said second conductive core to a reference voltage source; and
- electrically connecting said second conductive core to a current limiting resistor.

19. The method of claim 14, further comprising the steps of:
- electrically connecting said conductive core of said insulated conductive member to a reference voltage source; and
- electrically connecting said conductive core of said insulated conductive member to a current limiting resistor.

20. The method of claim 19, wherein said monitoring step further comprises the step of measuring said voltage across said current limiting resistor.

* * * * *